United States Patent [19]

Antypas

[11] 4,227,962
[45] Oct. 14, 1980

[54] PREVENTION OF DECOMPOSITION OF PHOSPHOROUS CONTAINING SUBSTRATES DURING AN EPITAXIAL GROWTH SEQUENCE

[75] Inventor: George A. Antypas, Los Altos, Calif.

[73] Assignee: Varian Associates, Inc., Palo Alto, Calif.

[21] Appl. No.: 19,375

[22] Filed: Mar. 12, 1979

[51] Int. Cl.³ .............................................. H01L 21/20
[52] U.S. Cl. .............................. 156/624; 156/DIG. 70; 156/DIG. 89; 427/87
[58] Field of Search ......... 427/87; 156/624, DIG. 70, 156/DIG. 89

[56] References Cited

U.S. PATENT DOCUMENTS

| | | | |
|---|---|---|---|
| 2,944,975 | 7/1960 | Folberth | 156/DIG. 89 |
| 3,021,196 | 2/1962 | Merkel | 156/DIG. 89 |
| 3,556,732 | 1/1971 | Chang et al. | 156/DIG. 89 |
| 3,925,119 | 12/1975 | Philbrick et al. | 156/DIG. 70 |
| 3,948,693 | 4/1976 | Weyrich et al. | 156/624 |
| 4,095,004 | 6/1978 | Fraas et al. | 427/87 |

OTHER PUBLICATIONS

Batyrev et al., "Evaporation of Phosphorous . . . ," Isvestiya Akedemii Nauk SSSR, Neorganischeski Materialy, 14(6), pp. 1023-1026 (1978).

Lyutovich et al., "Influence of Substrate Temperature and PCl Partial Pressure . . . ," Isvestiya Akademii Nauk Uzbeksoi SSSR, Seriya Fizio-Matematicheskikh Nauk, 17(2), pp. 60-62 (1973).

Srnanek et al., "Loss of Phosphorus from In-InP System During Annealing," Chem. Zvesti 29(4), pp. 434-438 (1976).

Primary Examiner—John D. Smith
Attorney, Agent, or Firm—Stanley Z. Cole; Norman E. Reitz

[57] ABSTRACT

Loss of phosphorous from a phosphorous containing substrate is eliminated by maintaining a partial pressure of phosphorous in the vicinity of the substrate higher than the inherent partial pressure of phosphorous over the material of the substrate. The higher phosphorous partial pressure is obtained by positioning in the vicinity of the substrate a solution of an element such as tin or antimony containing phosphorous. The solvent metals are so chosen as to have higher solubility for phosphorous compared to the solution of phosphorous in the substrate material. The solution is exposed to the substrate in close juxtaposition but does not make physical contact with the substrate. The phosphorous vapor pressure above the solution will be proportional to the concentration of phosphorous in the solution. Consequently, since the solution is selected to have a higher solubility for phosphorous compared to solutions consisting of substrate elements, the vapor pressure will be proportionally higher. Thus, the region above the exposed substrate will contain phosphorous at a vapor pressure higher than the inherent vapor pressure of the material of the substrate and phosphorous loss is eliminated.

5 Claims, 4 Drawing Figures

U.S. Patent    Oct. 14, 1980    4,227,962
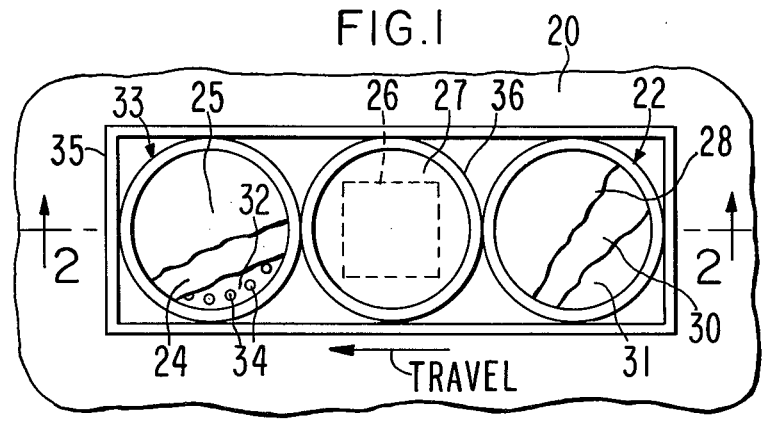
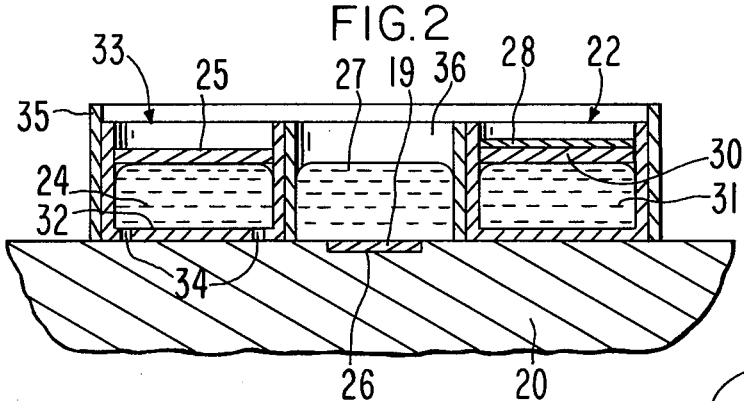
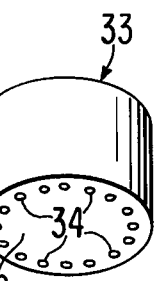
FIG.3
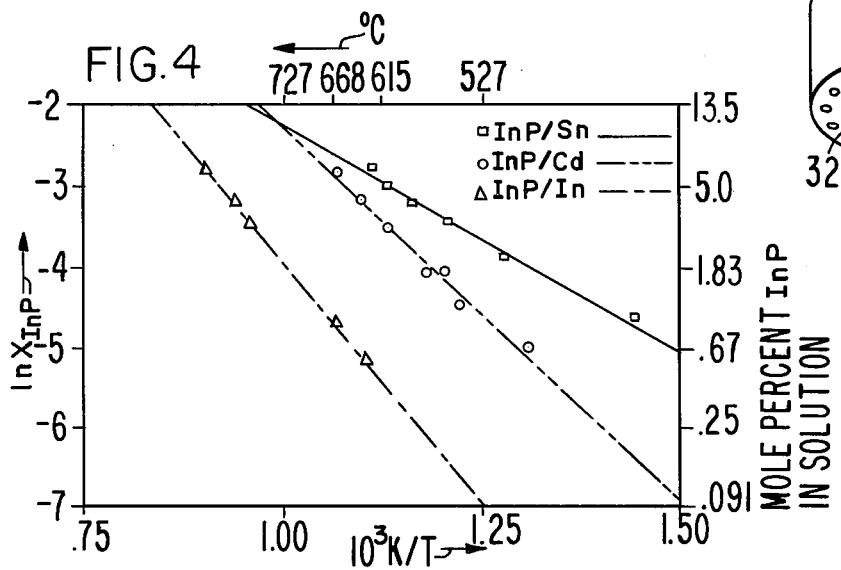

PREVENTION OF DECOMPOSITION OF PHOSPHOROUS CONTAINING SUBSTRATES DURING AN EPITAXIAL GROWTH SEQUENCE

This invention relates to a technique for epitaxial growth of phosphorous containing compounds of specified stoichiometry and, particularly, relates to a technique for preventing the loss of phosphorous from phosphorous containing compounds during an epitaxial growth sequence.

Phosphorous containing compounds are becoming more important as electronic materials for a number of electrooptic, microwave and photovoltaic applications. Such compounds include indium phosphide, gallium phosphide, aluminum phosphide, and III-V alloys incorporating the above compounds. Standard techniques for epitaxial growth of such compounds include liquid phase epitaxy, and vapor phase epitaxy including molecular beam epitaxy. With the various epitaxial growth techniques, it is typically necessary to maintain the substrate or at least the surface of the substrate at an effective temperature greater than 600° C. This is required in order to have an appreciable growth rate during epitaxy. At such temperatures, however, the partial pressure of phosphorous above a substrate of such phosphorous-containing compounds is high enough to produce significant losses of elemental phosphorous from the substrate. In any practicable system for epitaxial growth, there is a finite time required to bring the system up to an appropriate growth temperature and another finite time period required to cool the system down. The possibility of losing phosphorous during these times is a troublesome one. Such losses may lead to the consequence that the composition of the material is not precisely determined and that the surface structure deteriorates and device performance is impaired.

Several techniques have been used in the prior art to prevent the loss of phosphorous during epitaxial growth sequences involving phosphorous containing compounds. One approach is to position a graphite plug above the substrate prior to growth. The graphite plug occupies the region above the substrate so that the phosphorous partial pressure is maintained with significantly less transfer of phosphorous from the substrate. Some phosphorous is lost, however, particularly at the edges of the substrate. Another approach is to expose the surface of the phosphorous containing compound to a metallic melt which dissolves the surface to a selected depth so that a clean surface is left behind. For example, when the substrate is indium phosphide, an indium melt is pulled over a partially decomposed, phosphorous deficient surface to remove the topmost portion of the surface immediately prior to indium phosphide liquid phase epitaxy. This technique entails wasting material, and produces a surface that is not mirror smooth. A further technique is to use a polished wafer of the same material as the substrate material in intimate juxtaposition with the substrate. The small intervening volume is exposed to the two surfaces made from the identical material so that phosphorous losses are reduced by approximately one-half. This approach is also expensive and does not fully eliminate but only reduces decomosition. The common result of these approaches is to lessen the rate at which phosphorous is lost, but not to completely eliminate the loss. Consequently, the ability to prepare defect free epitaxial layers is impaired.

In order to increase the partial pressure of phosphorous over a phosphorous-containing substrate, a phosphorous-containing gas has been flowed over the substrate. For example, dilute solutions of $PH_3$ in $H_2$ have been passed over the surface. This technique serves to prevent phosphorous losses from the substrate but due to the kinetics of gas flow, phosphorous may be inadvertently introduced into the solution to be used for epitaxy thus altering the composition of the solution. To solve this problem it would be necessary, at least, to compartmentalize the growth reactor in order to protect adjacent melts and to carefully control flow conditions to prevent overexposure.

It is therefore an object of the present invention to prevent the loss of phosphorous from a phosphorous containing substrate by producing a vapor pressure for phosphorous above the substrate which exceeds the partial pressure of phosphorous for the material of the substrate.

It is an additional object of the present invention to provide in the vicinity of a phosphorous containing substrate a phosphorous containing solution of a material in which phosphorous has a greater solubility than in the material of the substrate.

It is an additional object of the present invention to prevent the loss of phosphorous from a phosphorous containing compound by the local generation of a vapor pressure sufficient to essentially eliminate phosphorous loss.

SUMMARY OF THE INVENTION

The loss of phosphorous from a phosphorous containing substrate is eliminated by maintaining a partial pressure of phosphorous the vicinity of the substrate higher than the inherent phosphorous partial pressure of the material of the substrate. The higher phosphorous partial pressure is obtained by positioning in the vicinity of the substrate a solution of an element such as tin or antimony in which phosphorous has a higher solubility than it has in the material of the substrate. The solution has phosphorous or a phosphorous containing compound dissolved as a solute. The solution is exposed in close juxtaposition with the substrate but does not make physical contact with the substrate. The phosphorous vapor pressure above the solution will be proportional to the concentration of phosphorous in the solution. Consequently, since the solution is selected to have a higher solubility for phosphorous compared to solutions of substrate elements, the vapor pressure will be proportionally higher. Thus, the region above the exposed surface of the substrate will contain phosphorous at a vapor pressure which is higher than the inherent vapor pressure of the material of the substrate.

BRIEF DESCRIPTION OF THE DRAWINGS

For a more complete understanding of the technique of the present invention reference may be had to the following drawings which are incorporated herein by reference and in which:

FIG. 1 is a plan view of a boat carrier in a liquid phase epitaxy reactor illustrating two boats for use with the technique of the present invention;

FIG. 2 is a cross-sectional view of FIG. 1 taken along line 2—2;

FIG. 3 is a bottom perspective view of a boat used in conjunction with the technique of the present invention; and FIG. 4 is a graph showing a comparison of the solubilities of indium phosphide in tin, cadmium and indium as a function of temperature (see J. Crystal Growth, V. 35, p. 60 [1976]).

DESCRIPTION OF THE PREFERRED EMBODIMENT

From the principles of thermodynamics it is known that at equilibrium the partial pressure of an element above a solution containing the element as a solute is proportional to the concentration of the solute in the solution. Thus, $$P_A = K \chi_A P^\circ_A$$

where K is a proportionality constant, $P_A$ is the partial pressure of element A, $\chi_A$ is the concentration of element A in the solution and $P^\circ_A$ is the partial pressure above bulk element A. In order to establish the partial pressure, for example, of phosphorous over a solution of indium, tin, or antimony at a designated concentration level it is necessary to dissolve phosphorous in each of the solutions to determine the proportionality constant and then to calculate $P_A$ for any given $\chi_A$.

By reference to the chart in FIG. 4 it can be seen that, for a given temperature, the solubility of indium phosphide in tin is approximately an order of magnitude greater, for example, than the solubility of indium phosphide in indium, in the temperature range of interest (600°–750° C.). Consequently, the vapor pressure of phosphorous above a tin solution will be much higher than above an indium solution in accordance with the equation set out above. In a practical system, of course, it will be necessary to have a sufficient supply of phosphorous in the solution or the high partial pressure cannot be maintained due to a continuous loss of phosphorous. This is achieved in the embodiment illustrated in FIGS. 1 and 2 by adding solid InP to the solution in a greater amount than required for complete saturation; as a result the undisolved solid InP acts as a phosphorous source for replenishment of the lost phosphorous. Alternatively, solid elemental phosphorous may be supplied to the solution, an approach that is feasible in vacuum environments.

The technique for preventing phosphorous losses of the present invention may be further understood by reference to FIGS. 1–3. In a heat-up, cool-down or waiting mode in a liquid phase epitaxy reactor, the bare substrate 26 or the epitaxial layer 19 grown on the surface of substrate 26 must be protected from decomposition. If the direction of travel of the boat train 35 is from right to left then boat or crucible 33 will be positioned above substrate 26 on support member 20 during the warm-up period and crucible 22 will be positioned over substrate 26 during the cool-down period. In accordance with the principles set out above, a melt is provided in the vicinity of the substrate of a material having a solubility for phosphorous higher than the material of the substrate. As shown, this melt is provided in the crucible 33 or 22 immediately above the substrate or grown epitaxial layer. In the case of an indium phosphide substrate, a solution of tin may be confined in the crucible 33 or 22. In order to maintain the requisite amount of phosphorous in the tin solution, a plug of indium phosphide 25 or 30 is floated upon the molten tin 24 or 31, respectively. Preferably, this plug 25 or 30 covers the whole surface of the melt so that no portion of the melt becomes depleted of phosphorous. If this should occur the solution with its propensity to dissolve phosphorous could act as a sink rather than as a source. Lid 28 of crucible 22 insures a good contact between the plug and the melt. The graphite boats are configured to fully cover the substrate and are positioned immediately above the substrate. An array of small holes 34, seen in the break-away portion of FIG. 1 and in FIG. 3, is configured in the bottom 32 of the graphite crucibles so that a portion of the surface of the molten tin is exposed immediately above the substrate. The holes are chosen to be as large as possible to expose a significant area of the solution for rapid pressure equilibration but small enough so that the surface tension of the solution prevents it from coming in contact with the substrate. In a preferred embodiment a graphite crucible having holes 0.020 inches in diameter was used.

In operation in a liquid phase epitaxy reactor, the boats containing solutions to prevent decomposition will be pulled across the substrate in train with boats containing solutions for producing epitaxial growth. Thus, during the heat-up period, a graphite crucible 33 with the Sn-InP solution 24 as shown in FIGS. 1 and 2 will be positioned above the substrate. Following solution equilibration, various predetermined solutions 27 will be contained in crucible 36 and brought in contact with the substrate for the epitaxial growth cycle. Then, following epitaxial growth a Sn-InP solution 31 in crucible 22 will be placed above the substrate during the cool-down cycle. It has been found that the use of a tin solution saturated with phosphorous in the temperature range 600° to 750° substantially eliminates the decomposition a substrate of indium phosphide. Thus, it is not necessary to use either a melt to eliminate irregularities in the substrate surface, a companion wafer of the substrate material or a flow of a phosphorous-containing gas.

Since the saturation solubility of phosphorous will be different in different solutions, e.g., in Sn or in In, it will be possible to carefully control the partial pressure of phosphorous by varying the ratio of metals in a composite solution. Thus, a nearly linear progression of partial pressures can be obtained between the phosphorous partial pressure associated with tin and the phosphorous partial pressure associated with indium. In the embodiment previously discussed in which a plug of solid InP floats on a molten solution of Sn the phosphorous loss will be replenished from the InP source; this replenishment of phosphorous will be accompanied by increased concentration of In and as a consequence a decrease of the phosphorous partial pressure. This process will limit the useful life the solution depending on the rate of phosphorous loss.

While the technique of the present invention has been specifically described in connection with the prevention of surface decomposition with substrates of indium phosphide, it is realized that the technique is applicable to the prevention of decomposition in any phosphorous-containing compound. The technique has been described with reference to liquid phase epitaxy but is applicable to any situation where phosphorous loss from a substrate needs to be prevented. For example, during the annealing of implanted layers volatile elements can be lost. Typically, silicon dioxide or silicon nitride is used to prevent phosphorous loss during annealing of ion implanted InP. The technique of the present invention may be employed during the annealing step to prevent the loss of phosphorous, thereby eliminating the step of capping with silicon dioxide or silicon nitride. The technique of the present invention, then, is intended to be applicable in these areas and any additional areas that come within the scope of the art and the appended claims.

What is claimed is:

1. A technique for preventing the decomposition of a phosphorous-containing substrate during an epitaxial growth sequence which comprises in the vicinity of said substrate providing a phosphorous-containing solution in which phosphorous is a solute in a molten metal solvent, said solvent having a higher solubility for phosphorous than the solubility of phosphorous in the material of said substrate, and said solvent having sufficient phosphorous dissolved therein to produce a phosphorous partial pressure greater than the inherent partial pressure of phosphorous above the material of said substrate.

2. A technique in accordance with claim 1 wherein said phosphorous-containing solution is provided in a crucible having an array of small openings configured therein, said crucible being positioned in juxtaposition with said substrate so that said openings are adjacent said substrate, said small openings being large enough to permit exposure of said solution to said substrate but small enough to constrain the solution by surface tension from flowing through said openings.

3. A technique in accordance with claim 2 in combination with a plug of solid indium phosphide in contact with said solution in order to provide a continuous supply of phosphorous to said solution.

4. A technique in accordance with claim 3 wherein said solvent comprises tin.

5. A technique in accordance with claim 3 wherein said solvent comprises antimony.

* * * * *